United States Patent
Haishi et al.

(10) Patent No.: US 9,857,442 B2
(45) Date of Patent: Jan. 2, 2018

(54) IMAGING UNIT

(71) Applicant: MRTechnology, Inc., Tuskuba-shi (JP)

(72) Inventors: Tomoyuki Haishi, Tsukuba (JP); Kazunori Ishizawa, Tsukuba (JP)

(73) Assignee: MRTechnology, Inc., Tuskuba-shi (JP)

( * ) Notice: Subject to any disclaimer, the term of this patent is extended or adjusted under 35 U.S.C. 154(b) by 522 days.

(21) Appl. No.: 14/559,107

(22) Filed: Dec. 3, 2014

(65) Prior Publication Data

US 2015/0316627 A1  Nov. 5, 2015

(30) Foreign Application Priority Data

Apr. 30, 2014  (JP) ................ 2014-093690

(51) Int. Cl.
*G01R 33/34* (2006.01)
*G01R 33/36* (2006.01)
*G01R 33/30* (2006.01)
*G01R 33/385* (2006.01)

(52) U.S. Cl.
CPC ............. *G01R 33/30* (2013.01); *G01R 33/34* (2013.01); *G01R 33/36* (2013.01); *G01R 33/385* (2013.01)

(58) Field of Classification Search
CPC ........ G01R 33/44; G01R 33/36; G01R 33/34; G01R 33/38; G01R 33/3802; G01R 33/385; G01R 33/3858; G01R 33/30
USPC ................................. 324/318–322
See application file for complete search history.

(56) References Cited

U.S. PATENT DOCUMENTS

| | | | | |
|---|---|---|---|---|
| 5,378,989 A * | 1/1995 | Barber | ............ | G01R 33/385 324/318 |
| 2003/0164703 A1* | 9/2003 | Ferris | ............ | A61B 5/0555 324/318 |
| 2005/0198812 A1* | 9/2005 | Schuster | ............ | G01R 33/385 29/606 |
| 2008/0074112 A1* | 3/2008 | Abe | ............ | G01R 33/385 324/307 |
| 2009/0066332 A1* | 3/2009 | Yatsuo | ............ | G01R 33/385 324/318 |
| 2010/0060281 A1* | 3/2010 | Doyle | ............ | G01R 33/34053 324/318 |
| 2011/0227573 A1* | 9/2011 | Konijn | ............ | G01R 33/56572 324/318 |

FOREIGN PATENT DOCUMENTS

| | | |
|---|---|---|
| EP | 2680022 A2 | 1/2014 |
| JP | 2000-051174 | 2/2000 |

* cited by examiner

*Primary Examiner* — Melissa Koval
*Assistant Examiner* — Rishi Patel
(74) *Attorney, Agent, or Firm* — Kratz, Quintos & Hanson, LLP

(57) ABSTRACT

The present invention provides an imaging unit which can image small animals inexpensively and with high resolution. The imaging detector 22 of the imaging unit includes gradient magnetic field coils having a pair of bucket-shaped coils 51-53, 61-63 having the bottoms opposed to each other and generating gradient magnetic fields between the par of bucket-shaped coils 51-53, 61-63, and a detection coil 82 accommodated between the pair of bucket-shaped coils 51-53, 61-63, a housing portion 30 provided between the pair of bucket-shaped coils 51-53, 61-63 and housing an object to be imaged, and a detection coil 82 provided in the housing portion 30 and positioned near the housed object to be imaged.

6 Claims, 13 Drawing Sheets

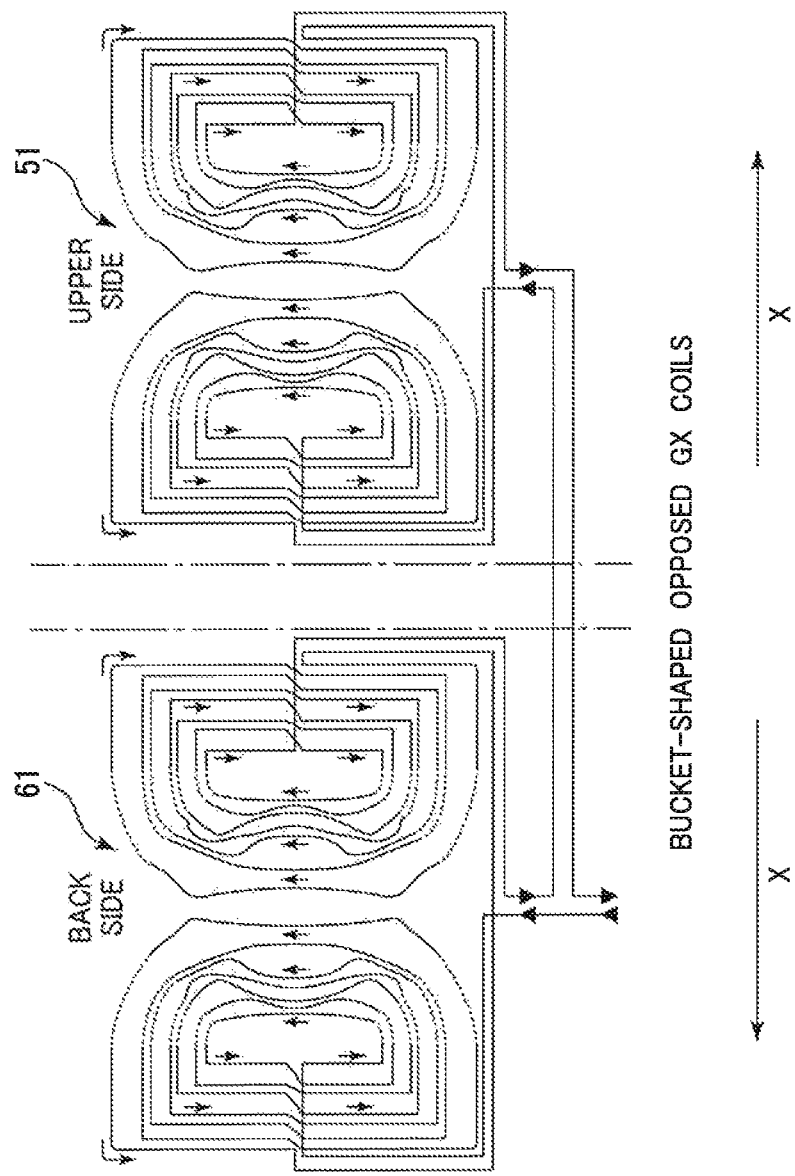

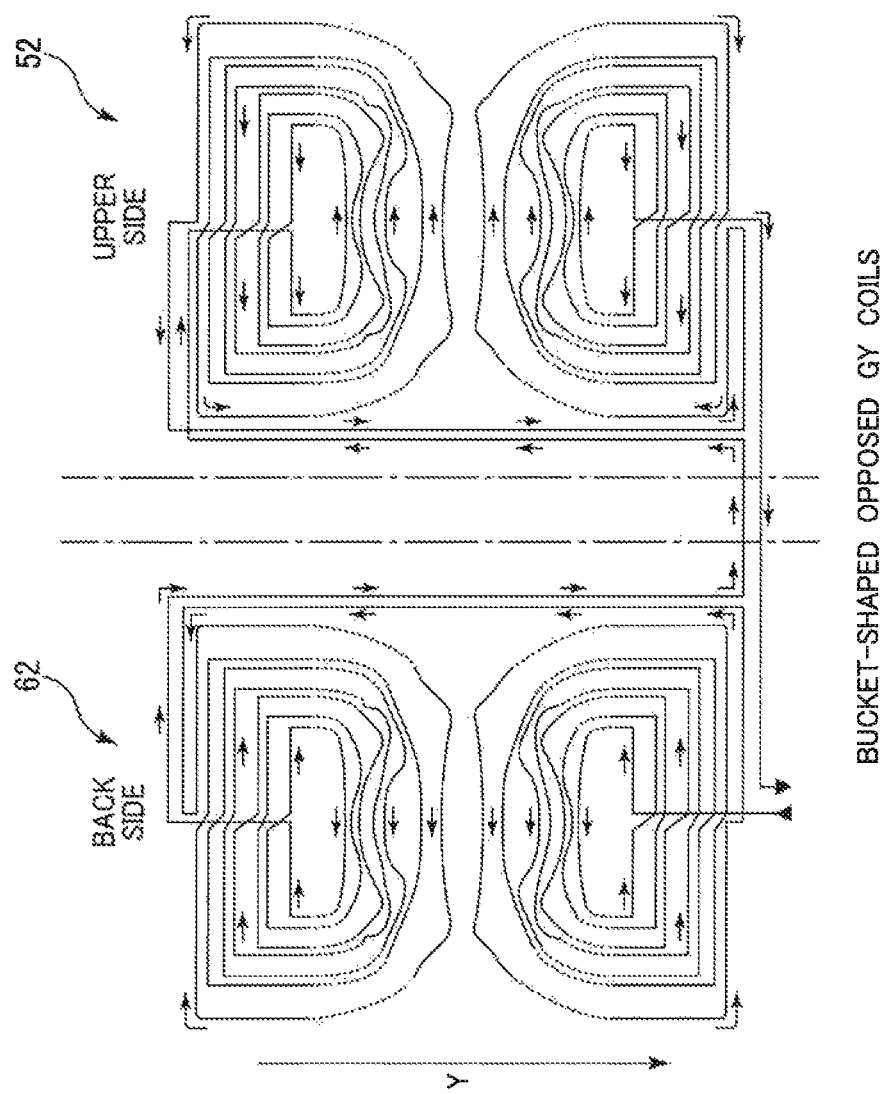

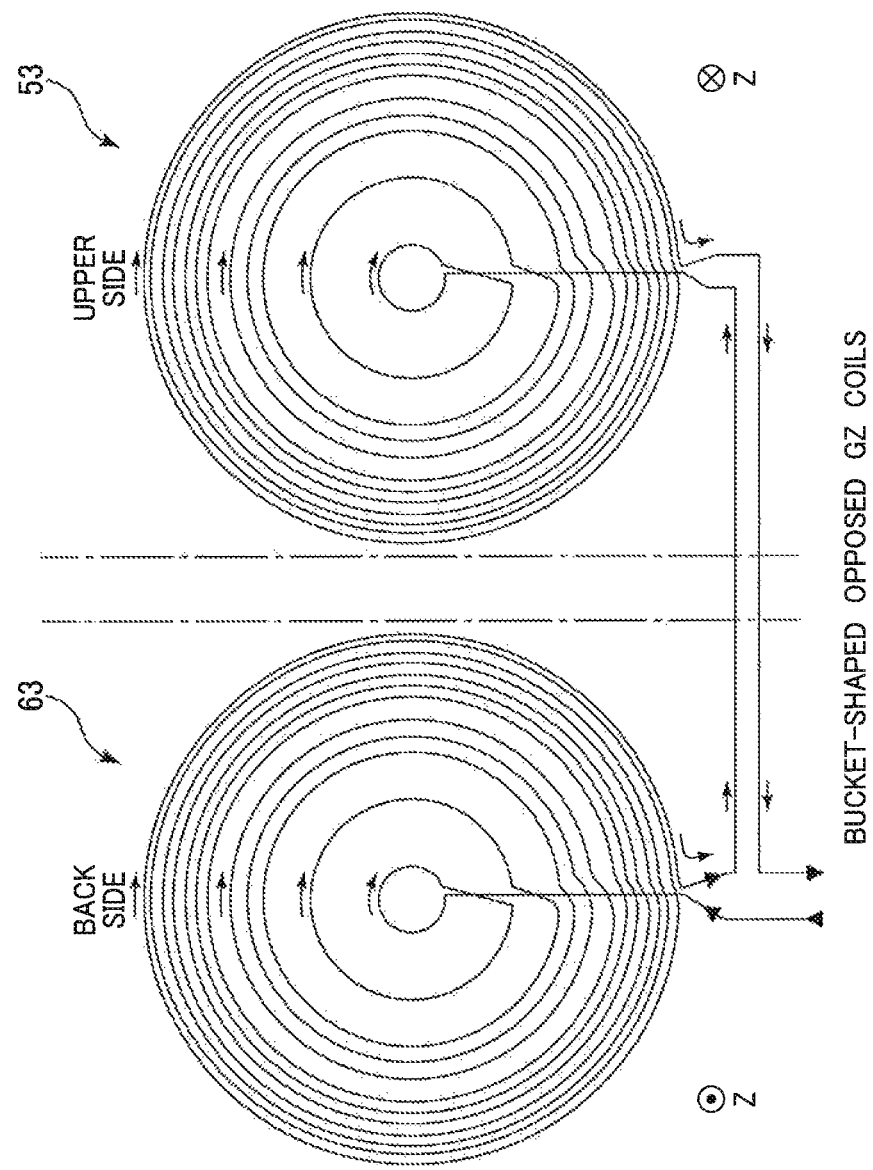

IMAGING UNIT

CROSS-REFERENCE TO RELATED APPLICATION

This application is based upon and claims the benefit of priority of the prior Japanese Patent Application No. 2014-93690, filed on Apr. 30, 2014, the entire contents of which are herein incorporated by reference.

TECHNICAL FIELD

The present invention relates to an imaging unit, more specifically, an imaging unit for imaging internal states of small animals by using nuclear magnetic resonance phenomenon.

BACKGROUND ART

Recently, the MRI (Magnetic Resonance Imaging) device using the MRI method of imaging internal information of small animals by using the NMR (Nuclear Magnetic Resonance) phenomenon is noted.

The clinical MRI device for imaging the human body is prevalent in the medical field. As the MRI device for imaging small animals and middle-sized animals, such as rats, monkeys, etc., the same horizontal MRI device as the clinical MRI device for the human body is generally used. The horizontal MRI device, which is expensive especially because of the superconducting magnet, is not widely used as the MRI device for small animals and middle-sized animals.

As a simple MRI imaging device, the NMR microscope (MRM) device utilizing the static magnetic field of the clinical MRI device is known. Since the MRM device does not require the high field superconducting magnet occupying most of the cost thereof, the MRM device capable of detection with high spatial resolution can be inexpensively realized (see Patent Reference 1).

PRIOR ART REFERENCES

Patent References

[Patent Reference]
Patent Reference 1: Unexamined Japanese Patent Publication No. 2000-51174

SUMMARY OF THE INVENTION

Problems to be Solved by the Invention

As described above, the MRI imaging device specialized for imaging small animals, such as mice, etc. requires the same structure as the clinical MRI device although the animals to be imaged are small animals. Since the body weight ratio of a mouse to the human being is smaller than 1/1000, the MRI imaging device requires a high static magnetic field intensity of more than 7 Tesla (including 7 Tesla) and an intense gradient magnetic field intensity of more than 40 mT/m including 40 mT/m, which makes the MRI imaging device large and expensive.

The NMR microscope device utilizing the static magnetic field of the clinical MRI device can be realized relatively inexpensively but is not suitable to image small animals because of the low static magnetic field intensity of the clinical MRI device.

An object of the present invention is to provide an imaging unit, which can image small animals inexpensively and with high resolution.

Means for Solving the Problem

The imaging unit according to one embodiment of the present invention comprising an imaging detector, the imaging detector comprising: gradient magnetic field coils including a pair of bucket-shaped coils having bottoms opposed to each other and generating gradient magnetic fields between the pair of bucket-shaped coils; a housing portion provided between the pair of bucket-shaped coils and housing an object to be imaged; and a detection coil provided in the housing portion and positioned near the housed object to be imaged.

Effects of the Invention

As described above, the present invention comprises an imaging detector, the imaging detector comprising: gradient magnetic field coils including a pair of bucket-shaped coils having bottoms opposed to each other and generating gradient magnetic fields between the pair of bucket-shaped coils; a housing portion provided between the pair of bucket-shaped coils and housing an object to be imaged; and a detection coil provided in the housing portion and positioned near the housed object to be imaged, whereby small animals can be imaged inexpensively and with high resolution.

BRIEF DESCRIPTION OF THE DRAWINGS

FIG. 6 is a view of the pattern of the X-axis gradient magnetic field bucket-shaped coils of the gradient magnetic coils of the imaging unit of the imaging system according to the one embodiment of the present invention.

FIG. 7 is a view of the pattern of the Y axis gradient magnetic field bucket-shaped coil of the gradient magnetic field coils of the imaging unit of the imaging system according to the one embodiment of the present invention.

FIG. 8 is a view of the pattern of the Z axis gradient magnetic field of the gradient magnetic coil of the imaging unit of the imaging system according to the one embodiment of the present invention.

MODE FOR CARRYING OUT THE INVENTION

An Embodiment

The imaging system according to one embodiment of the present invention will be described with reference to the drawings.

(Imaging System)

The imaging system according to the present embodiment will be described with reference to FIG. 1.

The imaging system according to the present embodiment uses the MRI (Nuclear Magnetic Resonance Imaging) method for imaging small animals such as mice and uses the NMR (Nuclear Magnetic Resonance) phenomenon to image in vivo information of small animals.

Figure 1:
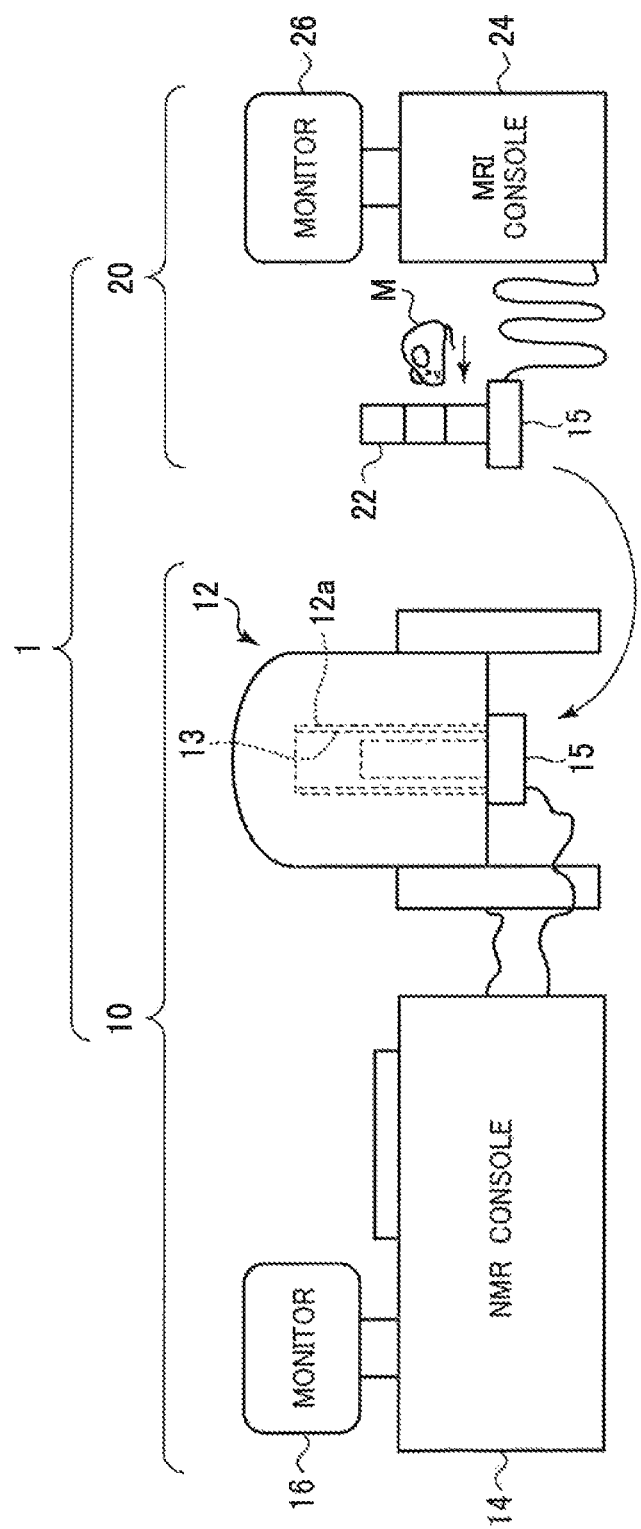
FIG. 1 is a block diagram of the imaging system according to one embodiment of the present invention.

As illustrated in FIG. 1, the imaging system according to the present embodiment combines an NMR device 10 of high resolution with an MRI unit 20 adjusted adaptable to small animals.

As the NMR device 10, an existing NMR device widely used in determining structures of organic compounds, etc. is used, which enables the imaging system of high resolution for small animals to be inexpensively realized.

The NMR device 10 includes a superconducting magnet 12, an NMR console 14, and a monitor 16 for operating the NMR console 14. In the present embodiment, the superconducting magnet included in the NMR device 10 is used, and the NMR console 14 and the monitor 16 will not be described in detail.

In the superconducting magnet 12 of the NMR device 10, a bore 12a for storing a sample is formed. The superconducting magnet 12 is so arranged that the bore 12a is vertically positioned. The superconducting magnet 12 is, e.g., a wide bore NMR magnet has an 89 mm inner bore 12a and a 0.8 m magnet outer diameter, which generates high magnetic fields of more than 4.7 Tesla including 4.7 Tesla.

The bore 12a of the superconducting magnet 12 is made of, e.g., a copper pipe. The bore 12a made of the copper pipe can decrease the cost of the NMR device 10 in comparison with the nonmagnetic stainless pipe generally used in the MRI device. The bore 12a may be made of a resin.

The MRI unit 20 includes an MRI detector 22 housing a small animal, e.g., a mouse M, an MRI console 24 for controlling the MRI detector 22, and a monitor 26 for operating the MRI console 24. In the bore 12a of the superconducting magnet 12, a shim coil 13 of the ordinary room temperature is stored and controlled by the NMR console 14. The MRI detector 22 is formed in an outer diameter, e.g., 72 mm conforming the configuration of the room temperature shim coil 13 stored in the bore 12a of the superconducting magnet 12, i.e., the configuration of an 89 mm outer diameter and a 73 mm inner diameter. The room temperature shim coil 13 can be suitably removed. The outer diameter of the MRI detector 22 is, e.g., 88 mm when the room temperature shim coil 12 is removed.

When a small animal, e.g., a mouse M is imaged, the mouse M is housed in the MRI detector 22 of the MRI unit, and the MRI detector 22 housing the mouse M is stored in the bore 12a of the superconducting magnet 12 of the NMR device 10, whereby the inside of the small animal is imaged.

(MRI Unit of the Imaging System)

Figure 2:
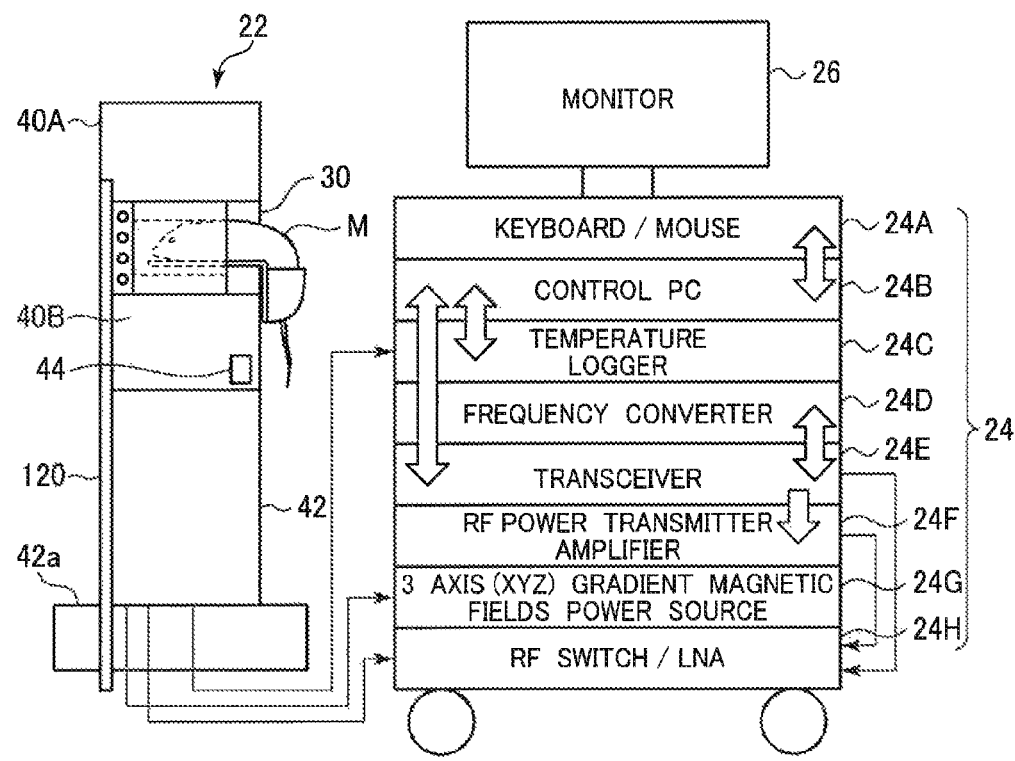
FIG. 2 is a block diagram of the imaging system according to the one embodiment of the present invention.

The MRI unit 10 of the imaging system according to this embodiment will be described with reference to FIG. 2.

The MRI unit 20 includes a mouse housing gap 30 for housing a small animal to be imaged, e.g., a mouse M, gradient magnetic field coils 40A, 40B provided on and below the mouse housing gap 30 and generating gradient magnetic fields, and a mount 42 supporting the gradient magnetic field coils 40A, 40B and the mouse housing gap 30. A flange 42a is provided on the mount 42 for securing the MRI unit 20 to the superconducting magnet 12. The mouse housing gap 30, the gradient magnetic field coils 40A, 40B will be detailed below.

When the MRI unit 20 is loaded, the position of the mouse housing gap 30 is so adjusted by the mount 42 that the mouse housing gap is located at a required position where the magnetic fields in the bore 12a of the superconducting magnet 12 are uniform.

Below the gradient magnetic field coil 40B, a platinum thermometric resistor 44 for measuring temperature is provided.

The MRI console 24 includes a keyboard/mouse 24A to be operated by an operator, a control PC 24B for generally controlling the MRI console 24, a temperature logger 24C for the temperature measurement, a frequency converter 24D for synchronizing a transceiver 24E with NMR frequencies; the transceiver 24E for the detection of the NMR signals and the modulation of the transmitted signals, an RF power transmitter amplifier 24F for supplying a power (about 50 W at maximum) to an RF coil 34, a 3 axis (XYZ) gradient magnetic fields power source 24G, and an RF switch/LNA 24H for timely switching the high frequency NMR signals and the transmitted signals.

The platinum thermometric resistor 44 is connected to the temperature logger 24C. The temperature logger 24C monitors the temperature of the gradient coil 40B to transmit the temperature to the control PC 24B, and the control PC 24B administers the safety of the MRI console 24. The gradient magnetic field coils 40A, 40B are connected to the three axis (XYZ) gradient magnetic field power source 57. A solenoid coil 82 is connected to the RF switch/LNA 24H via a trimmer capacitor 84 and a coaxial cable 85. The transceiver 24E and the RF power transmitter amplifier 24F are connected to the RF switch/LNA 24H.

(MRI Detection Unit)

Figure 3:
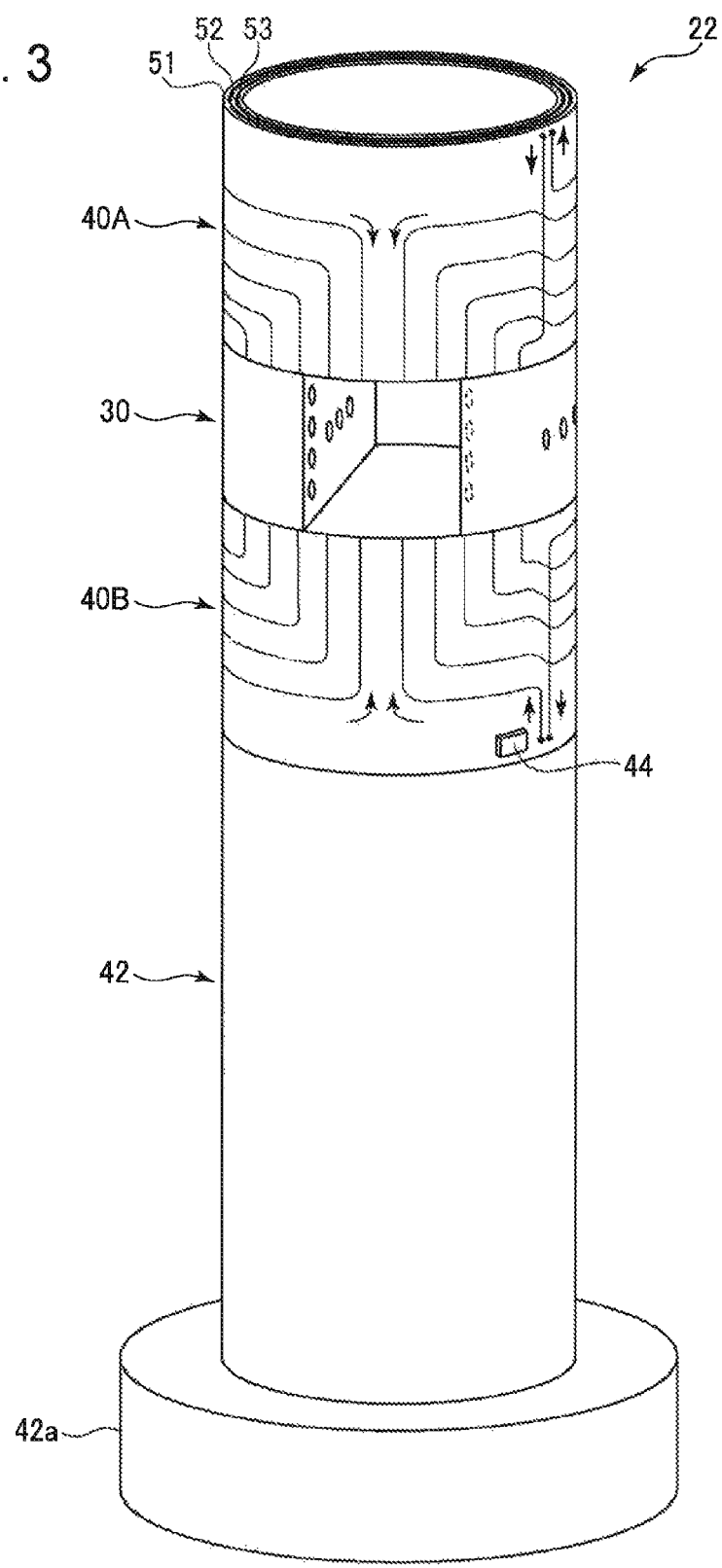
FIG. 3 is a perspective view of the MRI detector of the imaging unit of the imaging system according to the one embodiment of the present invention.
Figure 4:
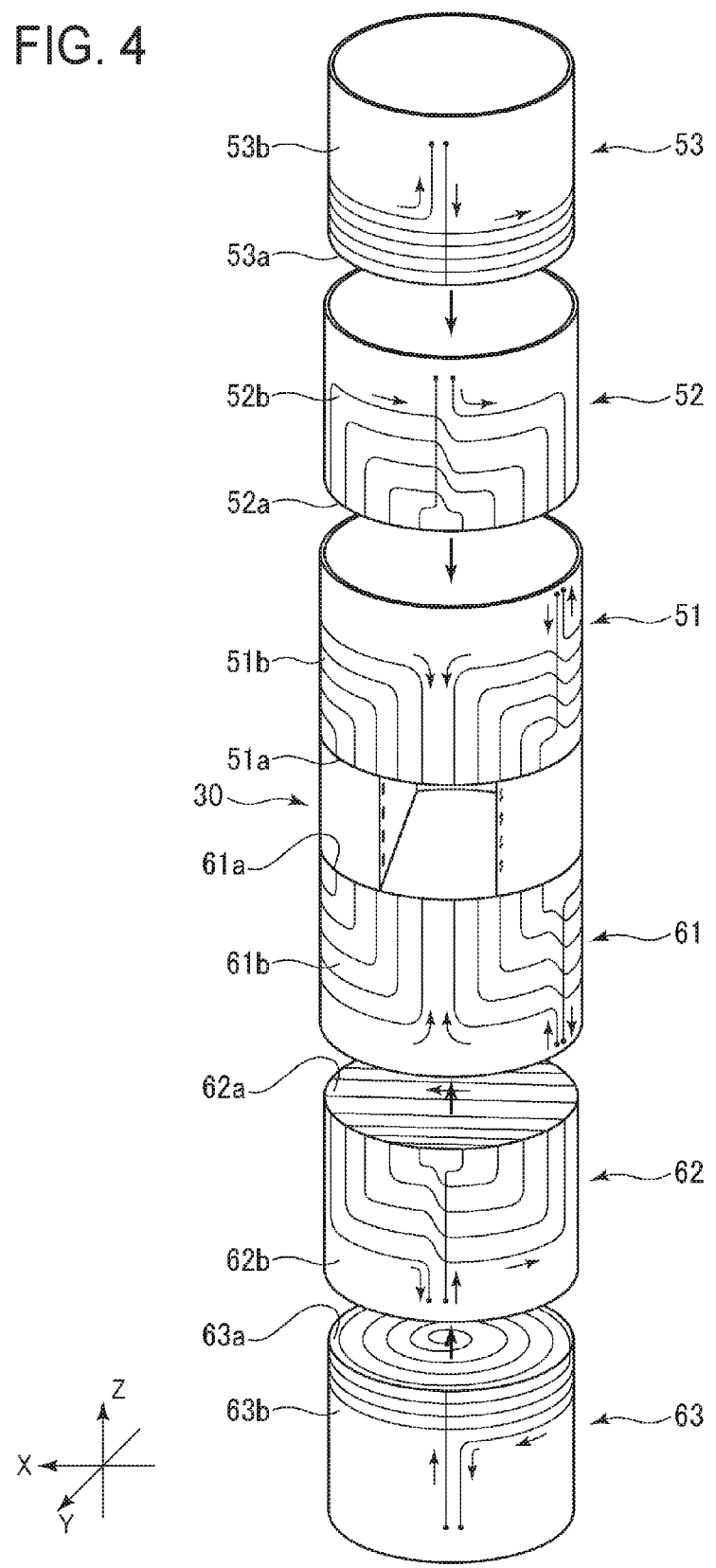
FIG. 4 is perspective view of the assembly of the MRI detector of the imaging unit of the imaging system according to the one embodiment of the present invention.

The MRI detector 22 of the MRI unit 20 of the imaging system according to this embodiment will be described with reference to FIGS. 3 and 4. FIG. 3 is a perspective view of the MRI detector 22, and FIG. 4 is a perspective view of the MRI detector.

The MRI detector 22 includes the mouse housing gap 30 for housing a small animal to be imaged, e.g., a mouse M, the gradient magnetic field coils 40A, 40B disposed on and below the mouse housing gap 30 and generating gradient magnetic fields, and the mount 42 supporting the gradient magnetic coils 40A, 40B and the mouse housing gap 30. The flange 42a is provided on the mount 42.

The MRI detector 22 has, e.g., a 72 mm diameter and a 120 mm full length. The gradient magnetic coils 40A, 40B respectively has a 70 mm diameter and a 32 mm height. The mouse housing gap 30 has a 56 mm height. The mount 42 has a 39 mm-diameter and a 310 mm height, and the flange 42a of the mount 42 has a 180 mm diameter and an 8 mm height.

The gradient magnetic coil 40A on the top of the mouse housing gap 30 is the upper half of a gradient magnetic coil, which has 3 layers of bucket-shaped coils 51, 52, 53 being superimposed on each other.

The gradient magnetic field coil 40B below the mouse housing gap 30 is the lower half of the gradient magnetic field coil having 3 layers of bucket-shaped coils 61, 62, 63 being superimposed on each other.

As illustrated in FIGS. 3 and 4, the upper gradient magnetic field coil 40A has the coil 52 inside the coil 51 of the outermost layer, and the coil 53 inside the coil 52.

As illustrated in FIG. 4, the lower gradient magnetic field coil 40B has the coil 62 inside the coil 61 of the outermost layer, and the coil 63 inside the coil 62.

The bucket-shaped coils 51, 52, 53 of the 3 layers are formed of, e.g., copper, and the total thickness of the 3 layers is, e.g., 5 mm.

The outermost bucket-shaped coil 51 has a 70 mm diameter bottom 51a, and a cylinder 51b of a 70 mm outer diameter, a 68 mm-inner diameter and a 30 mm height, the bottom 51a and the cylinder 51b being integrated.

The bucket-shaped coil 52 is so formed as to be accommodated in the bucket-shaped coil 51 without a gap defined therebetween, e.g., has a 67 mm diameter bottom 52a, and a cylinder 52b of a 67 mm-outer diameter, a 65 mm inner diameter and a 30 mm height, the bottom 52a and the cylinder 52b being integrated.

The bucket-shaped coil 53 is so formed as to be accommodated in the bucket-shaped coil 52 without a gap defined therebetween, e.g., has a 64 mm diameter bottom 53a, and a cylinder 53b of a 64 mm outer diameter, a 62 mm inner diameter and a 25 mm height, the bottom 53a and the cylinder 53b being integrated.

The 3 bucket-shaped coils 61, 62, 63 of the 3 layers are formed of, e.g., copper and have, e.g., a 5 mm thickness.

The outermost bucket shaped coil 61 has, e.g., a 70 mm outer diameter bottom 61a, and a cylinder 61b of a 70 mm-outer diameter, a 68 mm inner diameter and a 30 mm height, the bottom 61a and the cylinder 61b being integrated.

The bucket-shaped coil 62 is so formed as to be accommodated in the bucket-shaped coil 61 without a gap defined therebetween, e.g., has a 67 mm bottom 62a, and a cylinder 62b of a 67 mm outer diameter, a 65 mm inner diameter and a 30 mm height, the bottom 62a and the cylinder 62b being integrated.

The bucket-shaped coil 63 is so formed as to be accommodated in the bucket-shaped coil 62 without a gap defined therebetween, e.g., has a 64 mm diameter bottom 63a and a cylinder 63b of a 64 mm outer diameter, a 62 mm inner diameter and a 25 mm height, the bottom 63a and the cylinder 63b being integrated.

The outermost layer bucket-shaped coil 51 of the upper gradient magnetic field coil 40A and the outermost layer bucket-shaped coil 61 of the lower gradient magnetic coil 40B are so formed as to be integral with the mouse housing gap 30 as illustrated in FIG. 4.

The bucket-shaped coils 51, 52, 53 form the upper 3 axis (XYZ) gradient magnetic field coil 40A, and the bucket-shaped coils 61, 62, 63 form the lower 3 axis (XYZ) gradient magnetic field coil 40B. In this case, the 3 axis directions are the X axis direction which goes through both ears of the mouse M housed in the mouse housing gap 30, the Y axis direction which is along the horizontal body axis of the mouse M, and the Z axis which is vertical.

The bucket-shaped coil 51 is the X axis gradient magnetic field bucket-shaped coil 51 for generating, in the upper 3 axis (XYZ) gradient magnetic field coil 40A, gradient magnetic fields whose X-axis magnetic flux densities linearly change.

The bucket-shaped coil 52 is the Y axis gradient magnetic field bucket-shaped coil 52 for generating, in the upper 3 XYZ axis gradient magnetic field coil 40A, gradient magnetic fields whose Y-axis magnetic flux densities linearly change.

The bucket-shaped coil 53 is the Z axis gradient magnetic field bucket-shaped coil 53 for generating, in the upper 3 XYZ axis gradient magnetic field coil 40A, gradient magnetic fields whose Z-axis magnetic flux densities linearly change.

The bucket-shaped coil 61 is the X axis gradient magnetic field bucket-shaped coil 62 for generating, in the upper 3 XYZ 3 axis gradient magnetic field coil 40A, gradient magnetic fields whose X-axis magnetic flux densities linearly change.

The bucket-shaped coil 62 is the Y axis gradient magnetic field bucket-shaped coil 62 for generating, in the lower 3 XYZ axis gradient magnetic field coil 40B, gradient magnetic fields whose Y-axis magnetic flux densities linearly change.

The bucket-shaped coil 63 is the Z axis gradient magnetic field bucket-shaped coil 63 for generating, in the lower 3 XYZ axis gradient magnetic field coil 40B, gradient magnetic fields whose Z-axis magnetic flux densities linearly change.

Preferably, as described above, the furthermost layers are the Z axis coils 53, 63 so that the bucket-shaped coils 53, 63 are can be distant from the imaging center of the superconducting magnetic inner bore 12a. The Z axis coils 53, 63, which tend to secure homogenous regions which are small though, may be smaller furthermost layers, while the Z axis coils 53, 63 have the weakness of inducing eddy currents into the magnet inner bore 12a. Accordingly, the Z axis coils 53, 63 are the furthermost layers so as to be distant from the bore 12a, whereby the effect of reducing the eddy currents flowing in the bore 12a is achieved when the Z axis coils 53, 63 are in operation.

The size of the XYZ axis (XYZ) gradient magnetic coils 40A, 40B are decided by, e.g., the 72 mm diameter of the shim coil as the boundary condition and furthermore in consideration of a size of an object to be imaged. XYZ axis cancel coils (not illustrated) may be provided at the outside of the coils 51 and 61 (between the magnetic bore 12a and them). In this case, it is necessary to make the whole smaller so as to secure in advance a space of the cancel coils.

In this case, the numbers of turns of the XYZ axis cancel coils are so decided that with the XYZ axis cancel coils provided respectively in individual layers at the outside of the upper 3 axis (XYZ) gradient magnetic coil 40A and the lower 3 axis (XYZ) gradient magnetic coil 40B, and when a current of reverse polarities is flowed to them, a leakage magnetic field generated at the outside of the gradient magnetic field coils 40A, 40B does not arrive at the surface of the 89 mm inner bore of the superconducting magnet 12. In the same way, for the surface of the 73 mm diameter inner bore of the room temperature shim coil 13, the leakage magnetic field may be considered.

The shim coil 13 may be made of material which does not generate an eddy current. The XYZ axis cancel coils (not illustrated) is preferably arranged in order of a Z axis cancel coil, a Y axis cancel coil, and a X axis cancel coil from the magnetic bore 12a, but may be only the Z axis cancel coil with the X axis cancel coil and the Y axis cancel coil omitted due to the limited space.

In FIGS. 5A, 5B, 6, 7 and 8, one example of the patterns of the coils 51-53, 61-63 in the gradient magnetic coils 40A, 40B is illustrated.

Figure 5A:
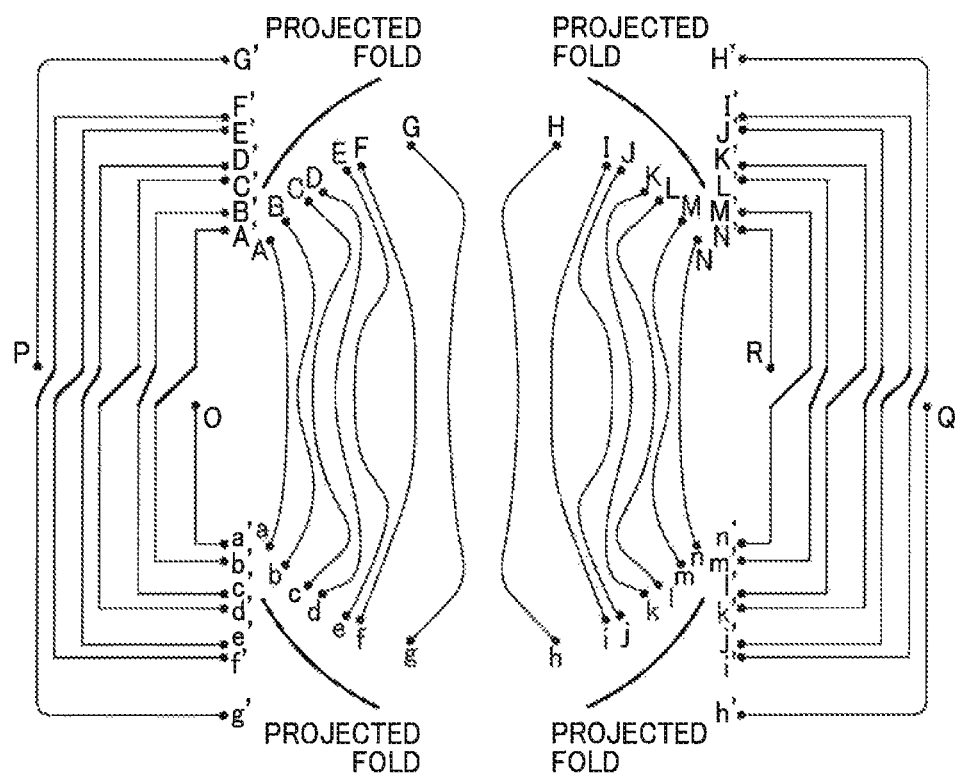
FIGS. 5A and 5B are views illustrating the patterns of the X axis gradient magnetic field bucket-shaped coil and the Y axis gradient magnetic field bucket-shaped coil of the gradient magnetic field coils of the imaging unit of the imaging system according to the one embodiment of the present invention.
Figure 5B:
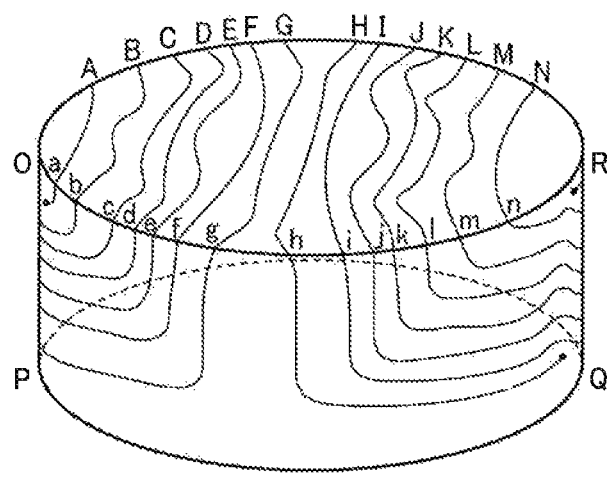

The patterns of FIGS. 5A and 5B are one example of the patterns of the X axis gradient magnetic field bucket-shaped coils 51, 61 and the Y axis gradient magnetic field bucket-shaped coils 52, 62. FIG. 5B is a perspective view of the pattern of the X axis gradient magnetic field bucket-shaped coils 51, 61 and the Y axis gradient magnetic field bucket-shaped coils 52, 62. FIG. 5A is the plan view of the pattern of the X axis gradient magnetic field bucket-shaped coils 51, 61 and the Y axis gradient magnetic field bucket-shaped coils 52, 62.

As illustrated in FIG. 5B, in the X axis gradient magnetic field bucket-shaped coils 51, 61, and the Y axis gradient magnetic field bucket coils 62, 62, a plurality of wires (A-a, B-b, C-c, . . . , N-n) are provided in parallel with the bottoms of the bucket-shaped coils so as to form an X-axis gradient magnetic field and a Y-axis gradient magnetic field. A plurality of wires (A-a, B-b, C-c, . . . , N-n) at the center of FIG. 5A are the wires provided on the bottoms of the bucket-shaped coils.

The pattern of the plural wires (A-a, B-b, C-c, . . . , N-n) are so given by computation that required linear gradient magnetic fields can be formed substantially at the center of the mouse housing gap 30.

In the cylinders of the bucket-shaped coils, a plurality of wires (A'-a', B'-b', C'-c', . . . , N'-n') which are the return wires of the plural wires (A-a, B-b, C-c, . . . , N-n) provided in parallel with the bottoms are provided. The plural wires (A'-a', B'-b, C'-c', . . . , N'-n') on the left and the right sides in FIG. 5A are the return wires provided in the bucket-shaped cylinders.

The pattern of the plural wires (A'-a', B'-b', C'-c', . . . , N'-n') is given by computation so as to less affect the gradient magnetic fields formed by the plural wires at the bottoms of the bucket-shaped coils.

The X axis gradient magnetic field bucket-shaped coils 51, 61, and the Y axis gradient magnetic field bucket-shaped coils 52, 62 are the same in the basic pattern except that the plural wires provided at the bottoms thereof are offset from each other by 90 degrees.

FIG. 6 illustrates the pattern of the bucket-shaped opposed GX coil. FIG. 6 is a plan view of the pattern of the bucket-shaped opposed GX coil.

The X axis gradient magnetic field bucket-shaped coil 51 of the upper gradient magnetic field coil 40A and the X axis gradient magnetic field bucket-shaped coil 61 of the lower gradient magnetic field coil 40B form a bucket-shaped opposed GX coil. The X axis gradient magnetic bucket-shaped coil 51 and the X axis gradient magnetic field bucket-shaped coil 61 are connected in a single wire as illustrated in FIG. 6.

A current is flowed in the arrowed direction of FIG. 6 in the respective wires of the X axis gradient magnetic field bucket-shaped coil 51 and the X axis gradient magnetic field bucket-shaped coil 61 to thereby form an X axis gradient magnetic field in the space between the opposed X axis gradient magnetic field bucket-shaped coil 51 and X axis gradient magnetic field bucket-shaped coil 61.

FIG. 7 illustrates the pattern of the bucket-shaped opposed GY coil. FIG. 7 is a plan view of the pattern of the bucket-shaped opposed GY coil.

The Y axis gradient magnetic field bucket-shaped coil 52 of the upper gradient magnetic coil 40A and the Y-axis gradient magnetic field bucket-shaped coil 62 of the lower gradient magnetic field coil 40B form the bucket-shaped GY coil. The Y-axis gradient magnetic field bucket-shaped coil 52 and the Y axis gradient magnetic field bucket-shaped coil 62 are connected in a single wire as illustrated in FIG. 7.

A current is flowed in the respective wires of the Y axis gradient magnetic field bucket-shaped coil 52 and the Y axis gradient magnetic field bucket-shaped coil 62 in the arrowed direction of FIG. 7 to thereby form a Y axis gradient magnetic field in the space between the opposed Y axis gradient magnetic field bucket-shaped coil 52 and Y axis gradient magnetic field bucket-shaped coil 62.

FIG. 8 illustrates the pattern of the bucket-shaped opposed GZ coil. FIG. 8 is a plan view of the pattern of the bucket-shaped opposed GZ coil.

In the Z axis gradient magnetic field bucket-shaped coils 53, 63, spiral wires are provided at the bottoms of the bucket-shaped coils as illustrated in FIG. 4. In the cylinders of the bucket-shaped coils, spiral wires are provided, which are connected to the spiral wires provided at the bottoms.

The Z axis gradient magnetic field bucket-shaped coil 53 of the upper gradient magnetic field coil 40A and the Z axis gradient magnetic field bucket-shaped coil 63 of the lower gradient magnetic field coil 40B form the bucket-shaped opposed GZ coil. The Z axis gradient magnetic field bucket-shaped coil 53 and the Z axis gradient magnetic field bucket-shaped coil 63 are connected in a single wire as illustrated in FIG. 8.

In the wire of the Z axis gradient magnetic field bucket-shaped coil 52 and the Z axis gradient magnetic field bucket-shaped coil 63, a current flows in the arrowed direction of FIG. 8 to thereby form a Z axis gradient magnetic field in the mouse housing gap 30, which is the space between the opposed Z axis gradient magnetic field bucket-shaped coil 53 and Z axis gradient magnetic field bucket-shaped coil 63.

(Mouse Housing Gap)

Figure 9A:
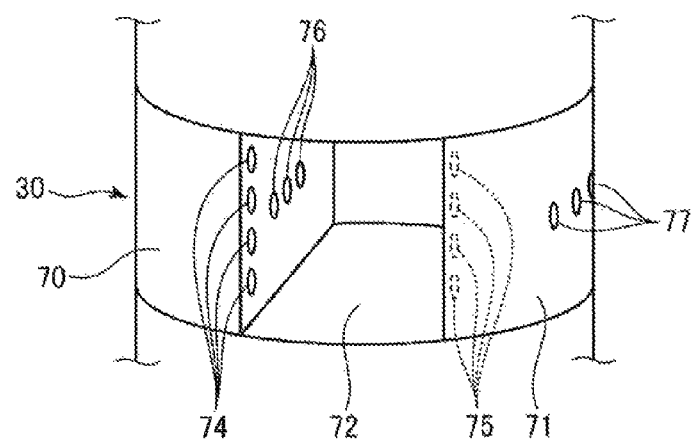
FIGS. 9A and 9B are views of the mouse housing gap of the MRI detector of the imaging unit of the imaging system according to the one embodiment of the present invention.
Figure 9B:
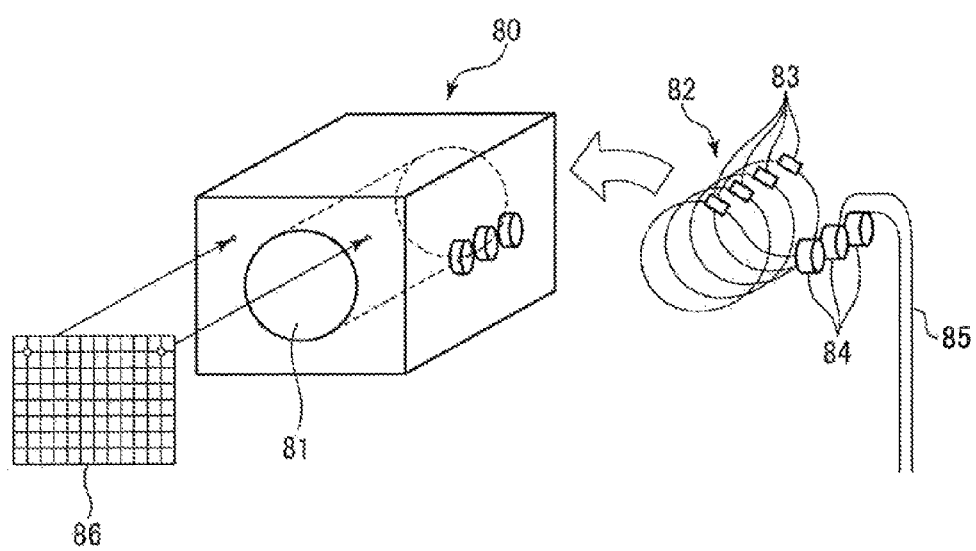

The mouse housing gap 30 of the MRI detector 22 of the imaging system according to the present embodiment will be described with reference to FIGS. 9A and 9B. FIG. 9A is a perspective view of the mouse housing gap, and FIG. 9B is a perspective view of the RF coil box.

The mouse housing gap 30 is illustrated in FIG. 9A. The mouse housing gap 30 is sandwiched between and integrated with the outermost layer bucket-shaped coil 51 of the upper gradient magnetic coil 40A and the outermost layer bucket-shaped coil 61 of the lower gradient magnetic coil 40B.

Left and right pillars 70, 71 are provided at the forward of the mouse housing gap 30 interconnecting the upper coil 51 and the lower coil 61. A pace 72 accommodating the RF coil box which will be described later is formed between the left pillar 70 and the right pillar 71.

In the forward part of the inside of the left pillar 70, LEDs 74 are buried for applying visual stimulations to the mouse M, and in the forward part of the inside of the right pillar 71, LEDs 75 for applying stimulations to the mouse M are buried. LEDs 74, 75 are suitably selected from white light, red light, green light, blue light and infrared.

At the center of the inside of the left pillar 70, holes 76 for rotating trimmer capacitors which will be described alter are formed, and at the center of the inside of the right pillar 71, holes 77 for rotating trimmer capacitors which will be described later are formed.

FIG. 9B illustrates the RF coil box 80. The RF coil box 80 is accommodated in the space 72 formed between the left pillar 70 and the right pillar 71. On the surface of the RF coil box 80, copper foil (not illustrated) of, e.g., an about 5-50 μm-thickness is laminated. A circular hole 81 is formed in the center of the RF coil box 80.

A solenoid coil 82 is housed so as to adjust to a central axis of the circular hole 81. The solenoid coils functions as a detecting coil of the MRI signal. A chip capacitor 83 and a trimmer capacitor 84 of variable capacity are provided with the solenoid coil 82. A coaxial cable 85 is connected to the solenoid coil 82.

The mouse M to be imaged is housed in a circular hole 81 of the RF coil box 80, and the mouse M is imaged by using the solenoid coil 82.

A copper net shield 86 for closing the circular hole 81 may be provided at the forward of the RF coil box 80. The copper net shield 86 is formed by knitting in mesh copper wires of, e.g., a 200 μm diameter. The copper net shield 86 admits visible light but no radio-frequency magnetic field. The copper net shield 86 is used in the case that the bidirectional functional MRI using the LEDs 74 is operated on the mouse M, and other cases.

(Venter Imaging Plate)

Figure 10A:
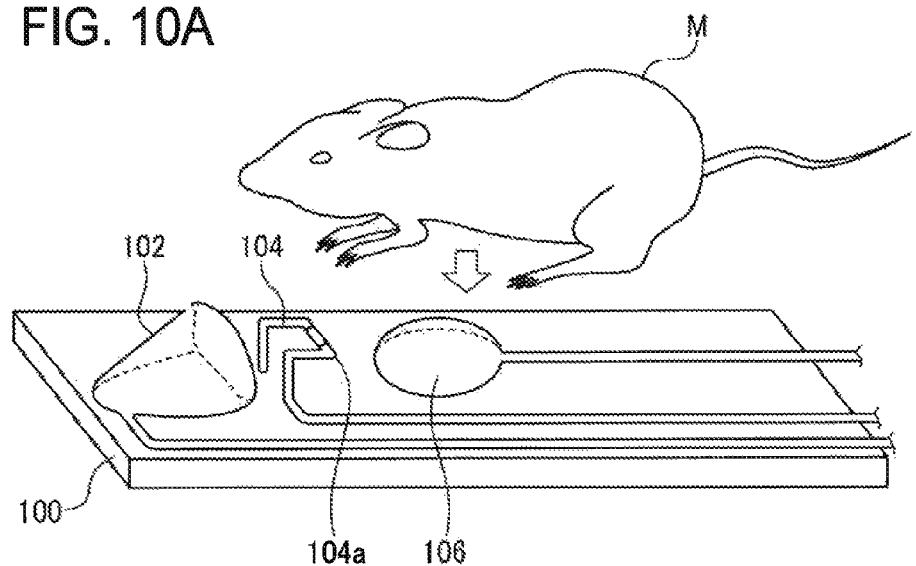
FIGS. 10A and 10B are views of the venter imaging plate used in the MRI detector of the imaging unit of the imaging system according to the one embodiment of the present invention.

The venter imaging plate used in the MRI detector 22 of the MRI unit 20 of the imaging system according to the one embodiment will be described with reference to FIGS. 10A and 10B. FIG. 10A is a perspective of the venter imaging plate, and FIG. 10B is a view of the MRI detector with the venter imaging plate loaded therein.

FIG. 10A illustrates the venter imaging plate 100. The venter imaging plate 100 is for imaging the venter of the mouse M to be imaged.

Figure 10B:
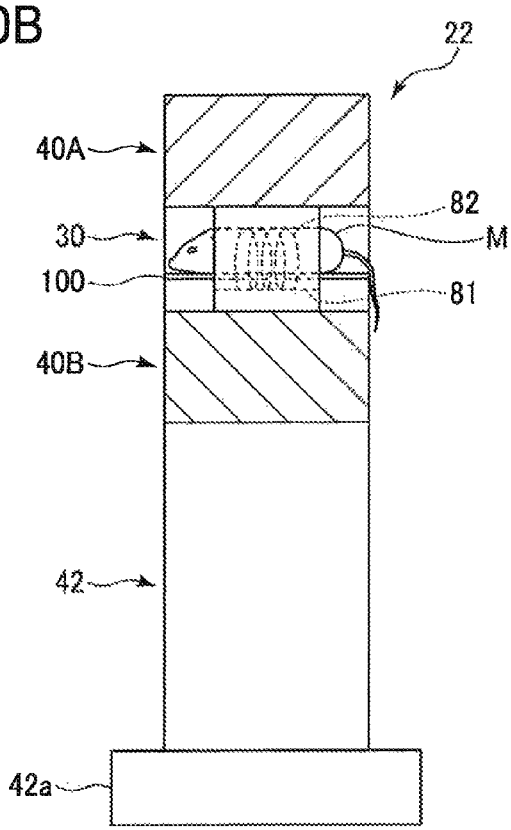

As illustrated in FIG. 10B, the venter imaging plate 100 has the entire length of the space 72 of the mouse housing gap 30. The venter imaging plate 100 is so formed that when the Mouse M to be imaged is loaded on the venter imaging plate 100, the venter of the mouse M is positioned substantially at the center of the space 72 of the mouse housing gap 30.

As illustrated in FIG. 10A, an anesthetic mask 102 is provided on the venter imaging plate 100 at a forward part. The anesthetic mask 102 is piped to the outside. As required, an anesthetic gas can be supplied from the outside to the mouse M through the anesthetic mask 102.

On the venter imaging plate 100, a bite bar 104 for the mouse M to bite is provided in front of the anesthetic mask 102. The position of the bite bar 104 is so adjusted that when the mouse M bites the bite bar 104, the venter of the mouse M is located at a required position, which is suitable for the imaging.

The bite bar 104 is made of a pipe which can admit liquid and is piped to the outside. An opening 104a is formed in the bite bar 104 at the part for the mouse M to bite. Sugared water, for example, is led into the bite bar 104 under suitable control, whereby the sugared water can be fed to the mouse M through the opening 104a.

At the center of the venter imaging plate 100, a heart beat and respiration detection balloon 106 is provided. When the mouse is housed, the torso of the mouse M presses the heart beat and respiration detection balloon 106. The heart beat and respiration detection balloon 106 is piped to the outside. Atmospheric pressure changes of the heart beat and respiration detection balloon 106 are detected to thereby detect the heart beat and the respiration of the mouse M.

When the mouse M can be sufficiently housed in the hole 81 of the RF coil box 80, the brain of the mouse M can be also imaged by the venter imaging plate 100 without using a brain imaging plate 110 which will be described below.

Also by using the anesthetic mask 102 and bite bar 104, the functional MRI can be operated on the mouse M.

(Brain Imaging Plate)

Figure 11A:
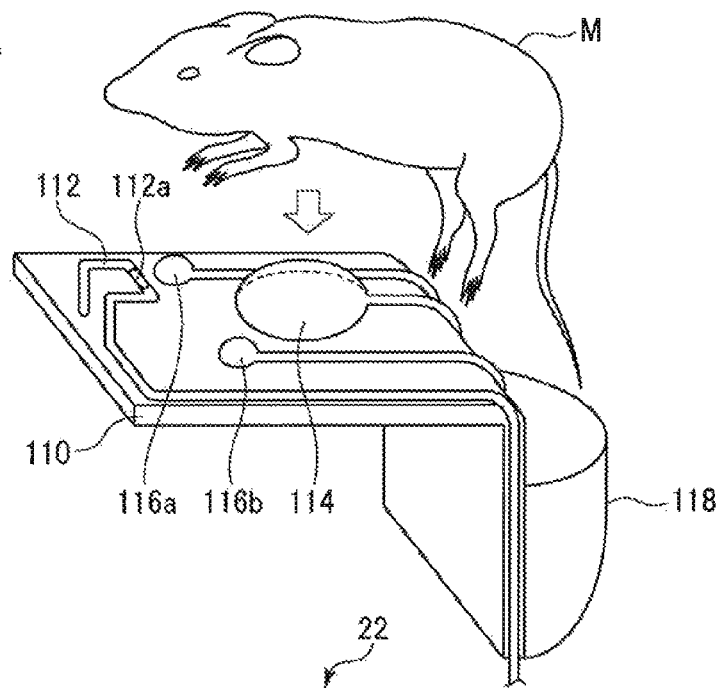
FIGS. 11A and 11B are views of the brain imaging plate used in the MRI detector of the imaging unit of the imaging system according to the one embodiment of the present invention.

The brain imaging plate to be used in the MRI detector 22 of the MRI unit 20 of the imaging system according to this embodiment will be described with reference to FIGS. 11A, 11B, and 12. FIG. 11A is a perspective view of the brain imaging plate, and FIGS. 11B and 12 illustrate the brain imaging plate loaded in the MRI detector.

FIG. 11A illustrates the brain imaging plate 110. The brain imaging plate 110 is for imaging the brain of the mouse M which has grown larger relatively to the space 72.

Figure 11B:
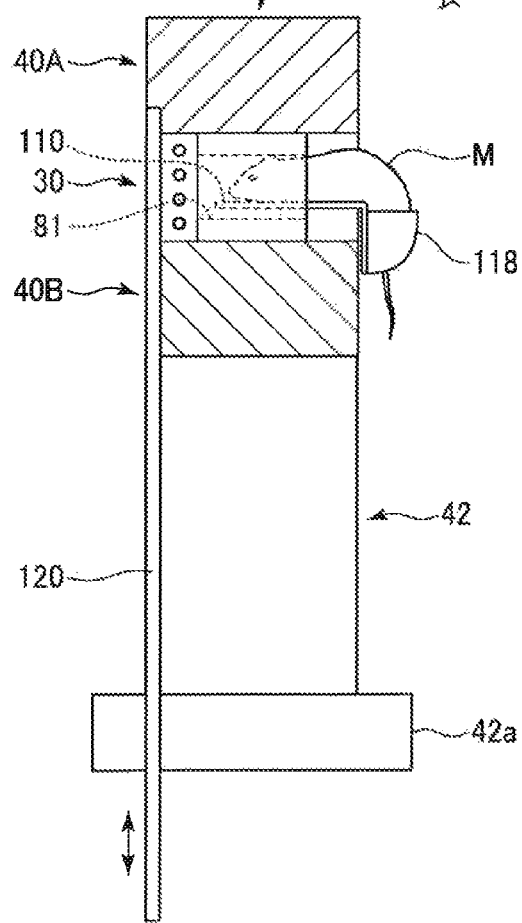
Figure 12:
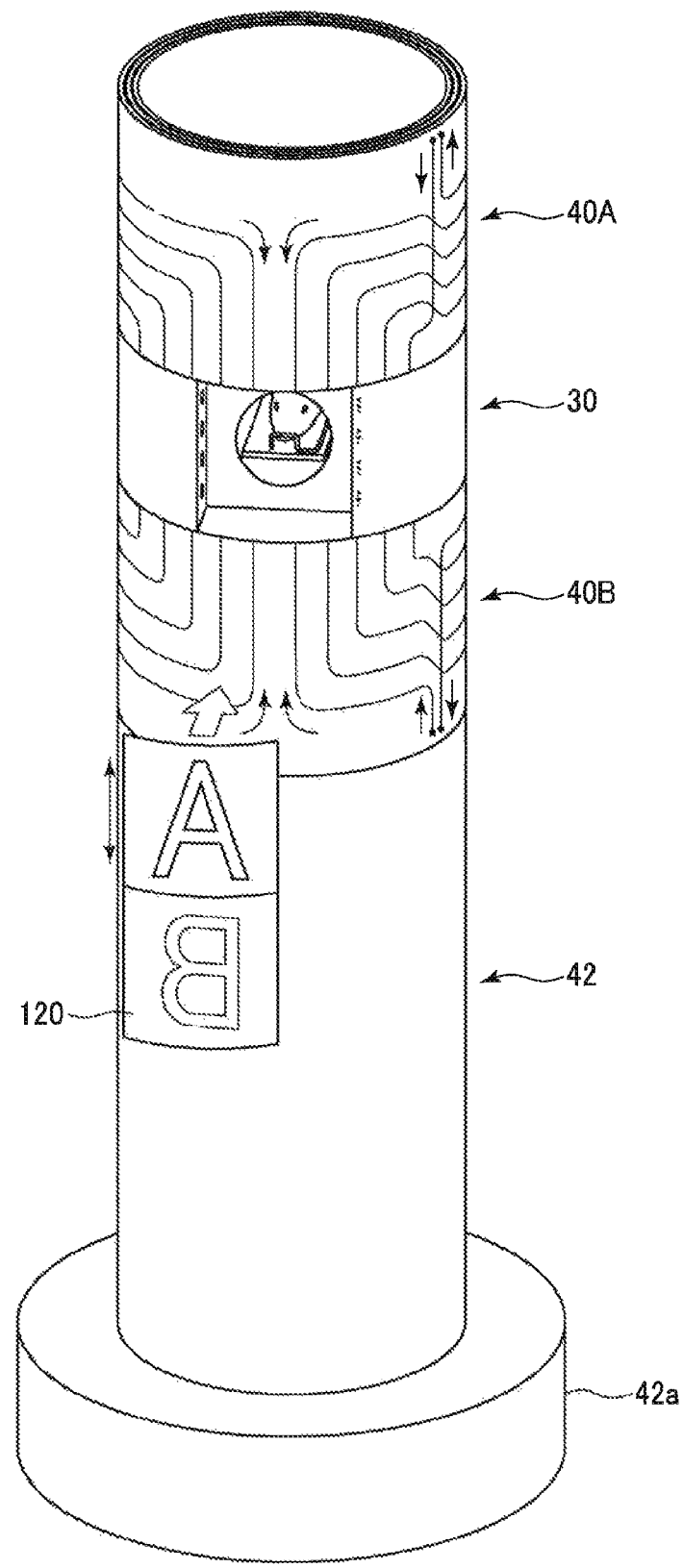
FIG. 12 is a perspective view of the MRI detector with the brain imaging plate in the imaging unit of the imaging system according to the one embodiment of the present invention.

As illustrated in FIG. 11B, the brain imaging plate 110 has the L-shape having an about ⅔ length of the total length of the space 72 of the mouse housing gap 30 bent downward. The brain imaging plate 110 is so formed that when the brain imaging plate 110 with the mouse loaded is loaded in the hole 81 of the RF coil box 80, the brain of the mouse M to be imaged is positioned substantially at the center of the space 72 of the mouse housing gap 30.

As illustrated in FIG. 11A, at the forward part of the brain imaging plate 110, a bite bar 112 for the mouse M to be imaged to bite is provided. The position of the bite bar 112 is so adjusted that when the mouse M bites the bite bar 112, the brain of the mouse is located at a prescribed position suitable for the imaging.

The bite bar 12 is made of a pipe which can admit liquid and piped to the outside. An opening 112a is formed in the bite bar 12 at the position for the mouse M to bite. Sugared water, for example, is led into the bite bar 112 under suitable control to feed the sugared water to the mouse M through the opening 112a.

A heart beat and respiration detection balloon 114 is provided at the center of the brain imaging plate 110. When the mouse M is housed, the torso of the mouse M pressed the heart beat and respiration balloon 114. The heart beat and respiration detection balloon 114 is piped to the outside. The atmospheric pressures from the heart beat and respiration balloon 114 are detected, whereby the heart beat and respiration of the mouse M can be detected.

Left and right pneumatic switches 16a, 16b are provided on the brain imaging plate 110 between the bite bar 112 and the heart beat and respiration detection balloon 114. The pneumatic switches 116a, 116b are piped to the outside. The pneumatic switches 116a, 116b are pushed by the forelimbs of the mouse M when the mouse M is housed. Air pressures of the pneumatic switches 116a, 116b are detected to thereby detect depressions by the forelimbs of the mouse M.

A pocket 118 for accommodating the hips of the mouse M is provided on the L-shaped brain imaging plate 110 at a rear part.

A display 120 as illustrated in FIG. 11B and FIG. 12 may be provided to show various images as a picture card show. For example, various images are shown on the display 120, and the display 120 is moved upward and downward to thereby display the various images before the mouse M housed in the mouse housing gap 30. In this case, the LEDs 74, 75 may be used as a light.

The bite bar 104, the pneumatic switches 116a, 116b and the display 120 are used to thereby operate the bidirectional functional MRI on the mouse M.

When the head of the mouse M to be imaged is imaged, depending on a size of the body of the mouse M to be imaged, the body of the mouse M abuts on the superconducting magnetic bore 12a, which makes it difficult to house in the mouse housing gap 30 with the head of the mouse M located at the center of the gradient magnetic field coils 40A, 40B where required linear gradient magnetic fields are formed.

Figure 13A:
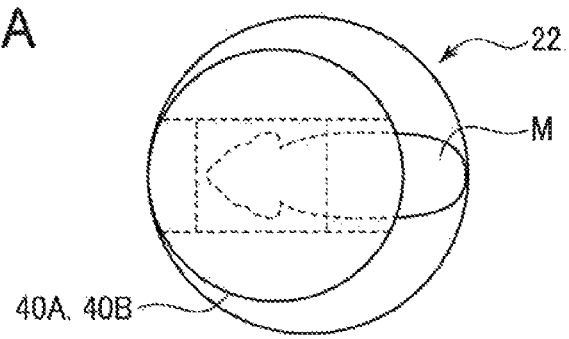
FIGS. 13A and 13B are views of another example of the MRI detector of the imaging unit of the imaging system according to the one embodiment of the present invention.
Figure 13B:
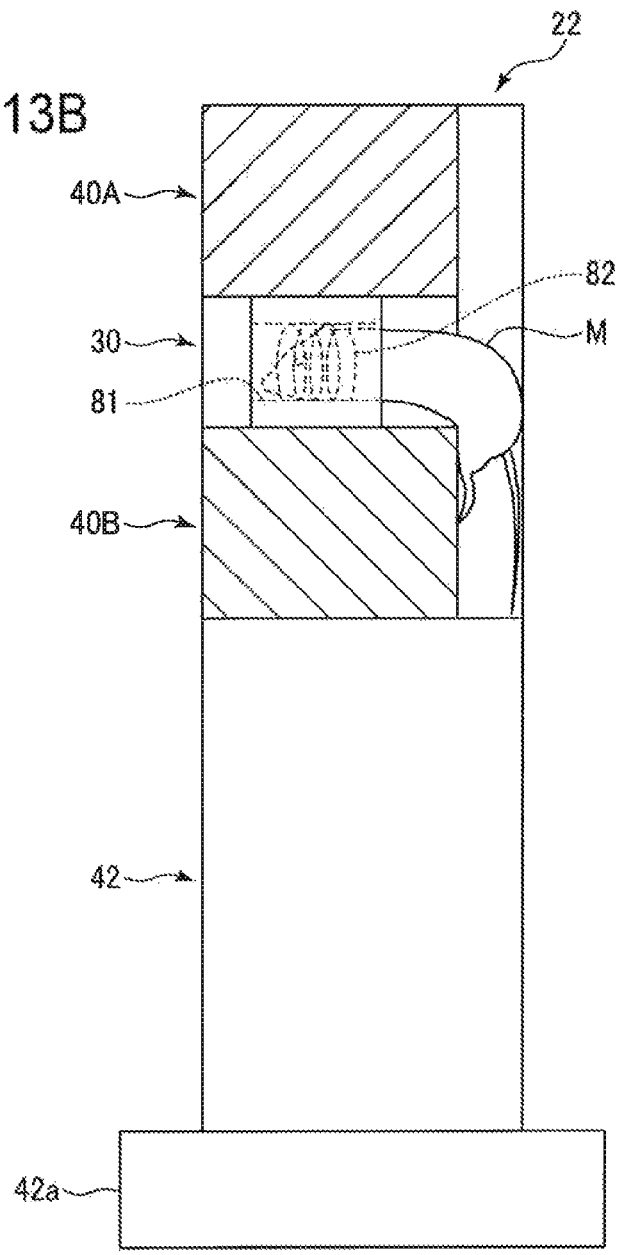

In such case, the positions of the gradient magnetic field coils 40A, 40B are offset to the center of the MRI detector 22. For example, as illustrated in FIGS. 13A and 13B, the gradient magnetic field coils 40A, 40B are offset left as viewed in FIGS. 13A and 13B, whereby the position for required linear gradient magnetic fields to be formed is shifted left to be agreed with the position of the head of the mouse M to be imaged.

Modified Embodiments

The present invention is not limited to the above-described embodiment and can cover other various modifications.

In the above-described embodiment, a small animal to be imaged is a mouse, but other small animals, e.g., the primates, such as rats, marmoset, etc., birds, etc. may be imaged. The small animals are not essential, and for example, insects, reptiles, birds, etc. may be imaged.

In the above-described embodiment, the static magnetic field of the superconducting magnet of the existing NMR device is utilized, but the static magnetic fields of other existing devices, e.g., clinical MRI devices may be utilized. Instead of the existing devices, a new magnet designed for the imaging unit according to the present invention may be used.

In the above-described embodiment, to superimpose the 3 bucket-shaped coils, the X axis gradient magnetic field bucket-shaped coil, the Y axis gradient magnetic field bucket-shaped coil and the Z axis gradient magnet field bucket-shaped coil are superimposed in the stated order from the side of the mouse housing gap 30. However, this order is not essential, and the 3 coil layers may be superimposed in any order.

In the above-described embodiment, the gradient magnetic field coils are bucket-shaped coils having the circuit bottoms and the cylinders integrated, but this is not essential. Bucket-shaped coils having bottoms of polygons, e.g., quadrangle, hexagon, octagon or others or bottoms of ellipse or others, and cylinders integrated may be used.

Furthermore, in the above-described embodiment, the gradient magnetic field coils are a pair of an upper bucket-shaped coil and a lower bucket-shaped coil, but this is not essential. A pair of a gradient magnetic field coil having, e.g., said upper bucket-shaped coil as the upper half and, as the lower half, a lower half of the generally used cylindrical gradient magnetic field coil may be optimized for use.

REFERENCE NUMBERS

1 . . . Imaging system
10 . . . NMR device
12 . . . Superconducting magnet
12a . . . Bore
13 . . . Room-temperature shim coil
14 . . . NMR console
15 . . . Sample measuring probe
16 . . . Monitor
20 . . . MRI unit
22 . . . MRI detector
24 . . . MRI console
24A . . . Keyboard/mouse
24B . . . Control PC
24C . . . Temperature logger
24D . . . Frequency converter
24E . . . Transceiver
24F . . . RF power transmitter amplifier
24G . . . 3 axis (XYZ) gradient magnetic fields power source
24H . . . RF switch/LNA
26 . . . Monitor
30 . . . Mouse housing gap
40A, 40B . . . Gradient magnetic field coils
42 . . . Mount
42a . . . Flange
51 . . . Upper X axis gradient magnetic field bucket-shaped coil
52 . . . Upper Y axis gradient magnetic field bucket-shaped coil
53 . . . Upper Z axis gradient magnetic field bucket-shaped coil
61 . . . Lower X axis gradient magnetic field bucket-shaped coil
62 . . . Lower Y axis gradient magnetic field bucket-shaped coil
63 . . . Lower Z axis gradient magnetic field bucket-shaped coil
70, 71 . . . Pillars
72 . . . Space
74, 75 . . . LEDs
76, 77 . . . Holes
80 . . . RF coil box
81 . . . Hole
82 . . . Solenoid coil
83 . . . Chip capacitor
84 . . . Trimmer capacitor
85 . . . Coaxial cable
86 . . . Copper net shield
100 . . . Venter imaging plate
102 . . . Anesthetic mask
104 . . . Bite bar
104a . . . Opening
106 . . . Heart beat and respiration detection balloon
110 . . . Brain imaging plate
112 . . . Bite bar
112a . . . Opening
114 . . . Heart beat and respiration detection balloon
116a, 116b . . . Pneumatic switches
118 . . . Pocket
120 . . . Display
M . . . Mouse

What is claimed is:

1. An imaging unit comprising an imaging detector, the imaging detector comprising:
gradient magnetic field coils including a pair of bucket-shaped coils each having a bottom and a cylinder which are integrated with each other, the bottom being located at one end of the cylinder, a surface of the cylinder being orthogonal to a surface of the bottom, the bottoms being opposed to each other, and generating gradient magnetic fields between the pair of the bucket-shaped coils;
a housing portion provided between the pair of bucket-shaped coils and housing an object to be imaged; and
a detection coil provided in the housing portion and positioned near the housed object to be imaged.

2. An imaging unit according to claim 1, wherein the coil for generating a gradient magnetic field is formed on the bottom of the bucket shaped coil, and a return wire of the coil is formed on the cylinder of the bucket shaped coil.

3. An imaging unit according to claim 1, wherein the gradient magnetic field coils including:
one of the pair of bucket-shaped coils having a first X axis gradient magnetic field bucket-shaped coil generating an X axis gradient magnetic field, a first Y axis gradient magnetic field bucket-shaped coil generating a Y axis gradient magnetic field, and a first Z axis gradient magnetic field bucket-shaped coil generating a Z axis gradient magnetic field, the first X axis gradient magnetic field bucket-shaped coil, the first Y axis gradient magnetic field bucket-shaped coil and the first Z axis gradient magnetic field bucket-shaped coil being superimposed on each other; and the other of the pair of bucket-shaped coils having a second X axis gradient magnetic field bucket-shaped coil generating a X axis gradient magnetic field, a second Y axis gradient magnetic field bucket-shaped coil generating a Y axis gradient magnetic field, and a second Z axis gradient magnetic field bucket-shaped coil generating a Z axis gradient magnetic field, the second X axis gradient magnetic field bucket-shaped coil, the second Y axis gradient magnetic field bucket-shaped coil and the Z axis gradient magnetic field bucket-shaped coil being superimposed on each other.

4. An imaging unit according to claim 1, wherein the detection coil is a solenoid coil wound around the object to be imaged.

5. An imaging unit according to claim 1, wherein the object to be imaged is a small animal, and the imaging detector is provided in the housing portion and further includes a bite bar for the small animal to bite.

6. An imaging unit comprising:
a static magnetic field magnet generating a static magnetic field in a detection space; and
an imaging unit comprising an imaging detector comprising: gradient magnetic field coils including a pair of bucket-shaped coils each having a bottom and a cylinder which are integrated with each other, the bottom being located at one end of the cylinder, a surface of the cylinder being orthogonal to a surface of the bottom, the bottoms being opposed to each other, and generating gradient magnetic fields between the pair of the bucket-shaped coils; a housing portion provided between the pair of bucket-shaped coils and housing an object to be imaged; and a detection coil provided in the housing portion and positioned near the housed object to be imaged, wherein
the imaging detector of the imaging unit is accommodated in the detection space of the static gradient magnetic field magnet so that the surface of the bottom of the bucket-shaped coil is orthogonal to a direction of the static magnetic field in the detection space and that the surface of the cylinder of the bucket-shaped coil is parallel to the direction of the static magnetic field in the detection space.

\* \* \* \* \*